(12) United States Patent  
Miura

(10) Patent No.: US 8,813,599 B2  
(45) Date of Patent: Aug. 26, 2014

(54) GEAR STRUCTURE

(75) Inventor: Yoshitaka Miura, Yokohama (JP)

(73) Assignee: JATCO Ltd., Fuji-shi (JP)

( * ) Notice: Subject to any disclaimer, the term of this patent is extended or adjusted under 35 U.S.C. 154(b) by 416 days.

(21) Appl. No.: 13/042,838

(22) Filed: Mar. 8, 2011

(65) Prior Publication Data

US 2011/0219898 A1  Sep. 15, 2011

(30) Foreign Application Priority Data

Mar. 9, 2010 (JP) ................. 2010-051357  
Nov. 4, 2010 (JP) ................. 2010-247308

(51) Int. Cl.  
*F16H 55/17* (2006.01)

(52) U.S. Cl.  
USPC .............................. 74/458; 74/437

(58) Field of Classification Search  
USPC .................... 74/458, 468, 437, 457  
See application file for complete search history.

(56) References Cited

U.S. PATENT DOCUMENTS

| | | | | |
|---|---|---|---|---|
| 3,894,615 A | * | 7/1975 | Lew ................. | 185/39 |
| 4,843,919 A | * | 7/1989 | Nemoto ............ | 475/344 |
| 6,354,395 B1 | * | 3/2002 | Cheng et al. ..... | 180/444 |
| 7,640,822 B2 | * | 1/2010 | Suzuki et al. .... | 74/458 |
| 7,814,808 B2 | * | 10/2010 | Shimizu et al. ... | 74/409 |
| 8,051,738 B2 | * | 11/2011 | Brust et al. ...... | 74/462 |
| 2010/0307274 A1 | * | 12/2010 | Akiyama ......... | 74/458 |

FOREIGN PATENT DOCUMENTS

| | | |
|---|---|---|
| JP | 08-312755 A | 11/1996 |
| JP | 2004-068855 A | 3/2004 |
| JP | 2007-040399 A | 2/2007 |
| JP | 2007-309399 A | 11/2007 |

* cited by examiner

*Primary Examiner* — Troy Chambers  
*Assistant Examiner* — Zakaria Elahmadi  
(74) *Attorney, Agent, or Firm* — Foley & Lardner LLP

(57) ABSTRACT

A gear structure comprising: a reinforcement member fixed onto a side surface of a gear; and a fixation section configured to fix the reinforcement member onto the side surface of the gear, the fixation section being provided on a line of contact action of the gear.

5 Claims, 4 Drawing Sheets

US 8,813,599 B2

GEAR STRUCTURE

BACKGROUND OF THE INVENTION (1) Field of the Invention

The present invention relates to a gear structure, namely, a structure of a gear which transmits a power according to a contact of at least one tooth of the gear with one tooth or more of another gear.

(2) Description of Related Art

A Japanese Patent Application First Publication No. Heisei 8-312755 published on Nov. 26, 1996 exemplifies a previously proposed gear structure in which a reinforcement member is fixed on a side surface of each of a pair of gears.

SUMMARY OF THE INVENTION

However, the above-described Japanese Patent Application Publication does not describe how the reinforcement member is fixed on the side surface of each of the pair of gears. As a result of an earnest discussion by the Applicant (Assigner), such a task that, depending upon a location of the side surface of each of the pair of gears on which the reinforcement member is fixed, a sufficient reinforcement effect by means of the reinforcement member cannot be obtained has been found.

It is, therefore, an object of the present invention to provide a gear structure which achieves the sufficient reinforcement effect by means of the reinforcement member.

According to one aspect of the present invention, there is provided a gear structure comprising: a reinforcement member fixed onto a side surface of a gear; and a fixation section configured to fix the reinforcement member onto the side surface of the gear, the fixation section being provided on a line of contact action of the gear.

DETAILED DESCRIPTION OF THE INVENTION

Figure 1A:
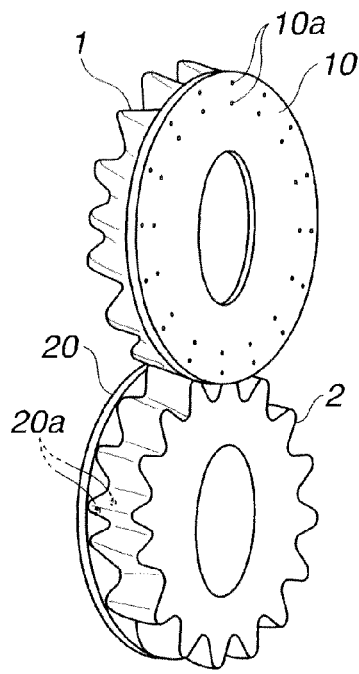
FIGS. 1A and 1B are rough structural views representing a contact of teeth of a pair of gears to which a gear structure in a preferred embodiment according to the present invention is applicable.
Figure 1B:
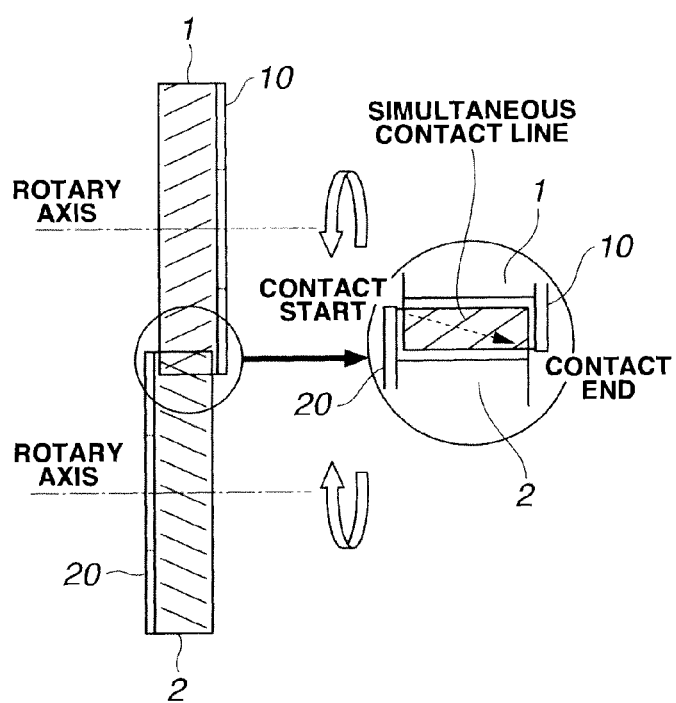

Reference will, hereinafter, be made to the drawings in order to facilitate a better understanding of the present invention. FIGS. 1A and 1B show a perspective view of a pair of helical gears and a front view thereof representing a contact (or an intermeshing) of the pair of gears to which a gear structure in a preferred embodiment according to the present invention is enabled to be adopted. In FIGS. 1A and 1B, a drive gear 1 connected to a drive source and a driven gear 2 meshed with (contacted with) drive gear 1 are the pair of helical gears and are standard involute gears, each gear having a tooth surface crossing obliquely with respect to a rotary axis. As shown in an expansion view of a contact part in FIG. 1B, when a deddendum part of drive gear 1 is meshed with (contacted with) an addendum part of driven gear 2 at a simultaneous contact line (called, a contact start), this simultaneous contact line is progressively moved. Finally, the addendum part of drive gear 1 and the deddendum part of driven gear 2 are meshed (contacted) at the simultaneous contact line and the contact of a certain tooth is ended (called, a contact end).

Reinforcement members 10, 20 are respectively fixed on side surfaces of drive gear 1 and driven gear 2, each of reinforcement members 10, 20 being fixed through a laser welding. These reinforcement members 10, 20 are disc-shaped metallic plates, an outer peripheral surface of each reinforcement member 10, 20 being formed of a size approximately coincident with an outermost peripheral surface of the corresponding one of pair of gears 1, 2 and an inner peripheral surface thereof being extended toward a more inner diameter side than a root of tooth thereof.

A penetrating hole is formed which is penetrated through a center of each of the pair of gears 1, 2 in order for a shaft or so forth to be penetrated therethrough. Two fixation sections 10a, 20a are respectively formed on respective gears 1, 2 in their radial directions of respective teeth of respective gears 1, 2 and arranged radially over the teeth of the whole periphery. The detailed positional relationship of fixation sections 10a, 20a will be described later. As shown in a partial expanded rough view of FIG. 1B, reinforcement member 10 is fixed on the side surface of drive gear 1 at the contact end side thereof and reinforcement member 20 is fixed on the side surface of driven gear 2 at the contact start side thereof. Although, in the preferred embodiment, the fixation is carried out by means of the (laser) welding, an engagement by means of a convex-and-recess section or the fixation using an adhesive may be applied in place of the welding.

Figure 2:
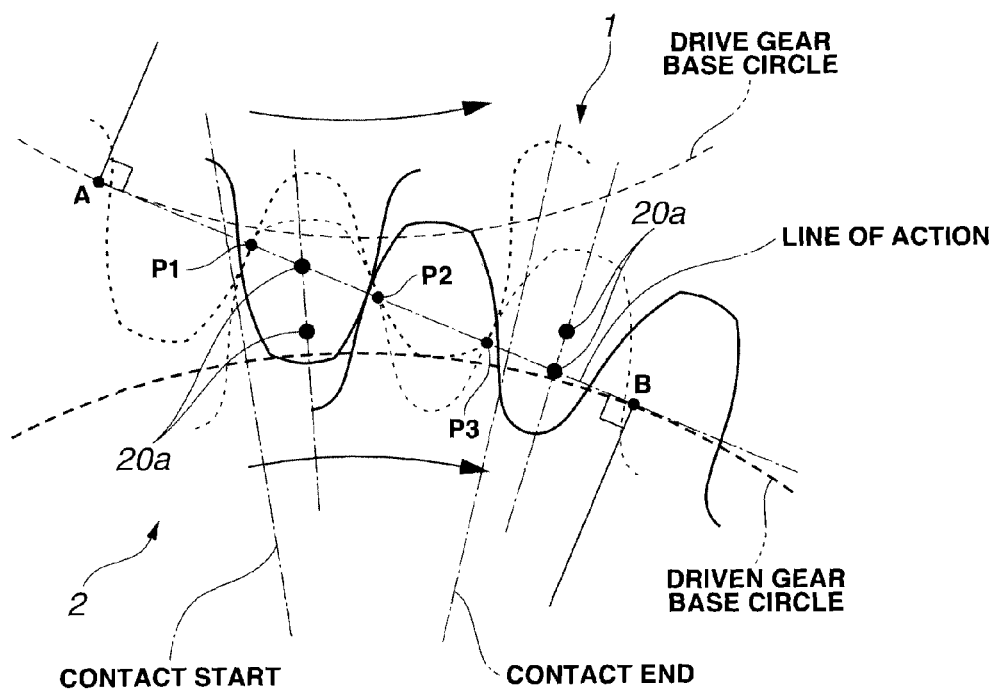
FIG. 2 is a partially expanded rough view of a gear contact part of the pair of gears to which the gear structure in the preferred embodiment according to the present invention is applicable.

FIG. 2 shows a partially expanded rough view of a gear contact portion of the helical gear pair in the preferred embodiment. In the standard involute gear, the gear contact is carried out with base circles of drive gear 1 and driven gear 2 as a basis. That is to say, a contact position is moved on a common tangent line A-B to a drive gear base circle and driven gear base circle. This common tangent line is, hereinafter, called a line of action (a line of contact action). An arbitrary tooth of drive gear 1 is contacted with a tooth of driven gear 2 at a contact start point on the line of action (refer to a dot-line tooth shadow in FIG. 2). Thereafter, when drive gear 1 is revolved, the contact position is moved as P1→P2→P3 moving on the line of action. Then, the contact between drive gear 1 and driven gear 2 is ended at a contact end point. In other words, at the gear contact portion, a force in a direction for drive gear 1 to press against driven gear 2 is always acted along the line of action.

Figure 3:
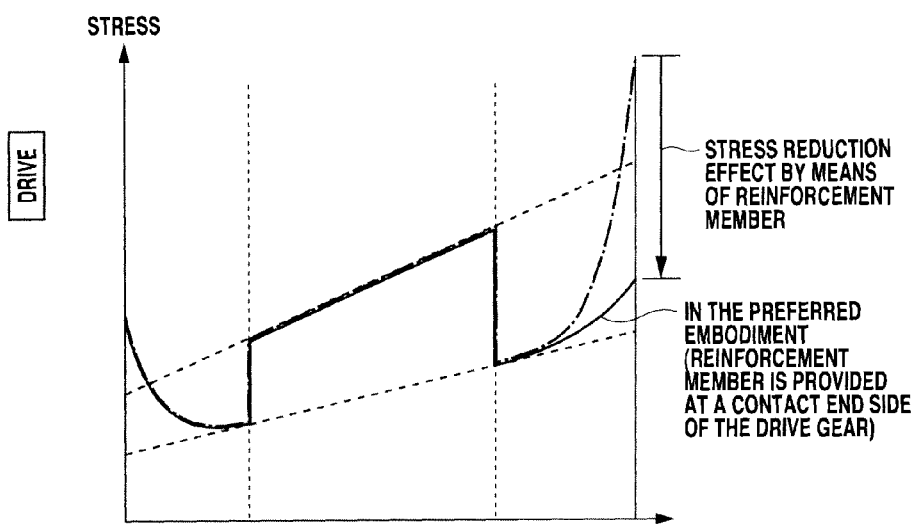
FIG. 3 is graphs representing a relationship between a stress received at a gear contact position by driven and drive gears from a contact start to a contact end and the number of contacted teeth of the gear pair.
Figure 3:
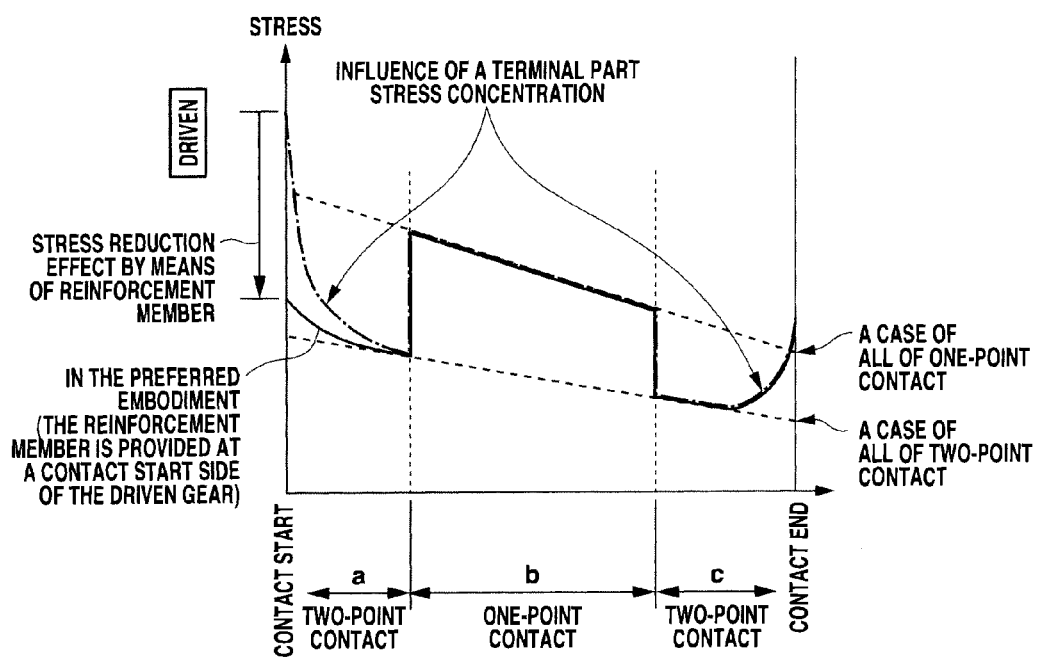

FIG. 3 shows graphs representing a relationship between a stress and a number of contact teeth at the contact position from the contact start to the contact end at drive gear 1 and at driven gear 2, respectively. A solid dot-and-dash line in FIG. 3 denotes a locus of a maximum stress in the gear structure without the reinforcement member (a comparative example) and a solid line in FIG. 3 denotes the locus of the maximum stress in the gear structure in the preferred embodiment.

Figure 5:
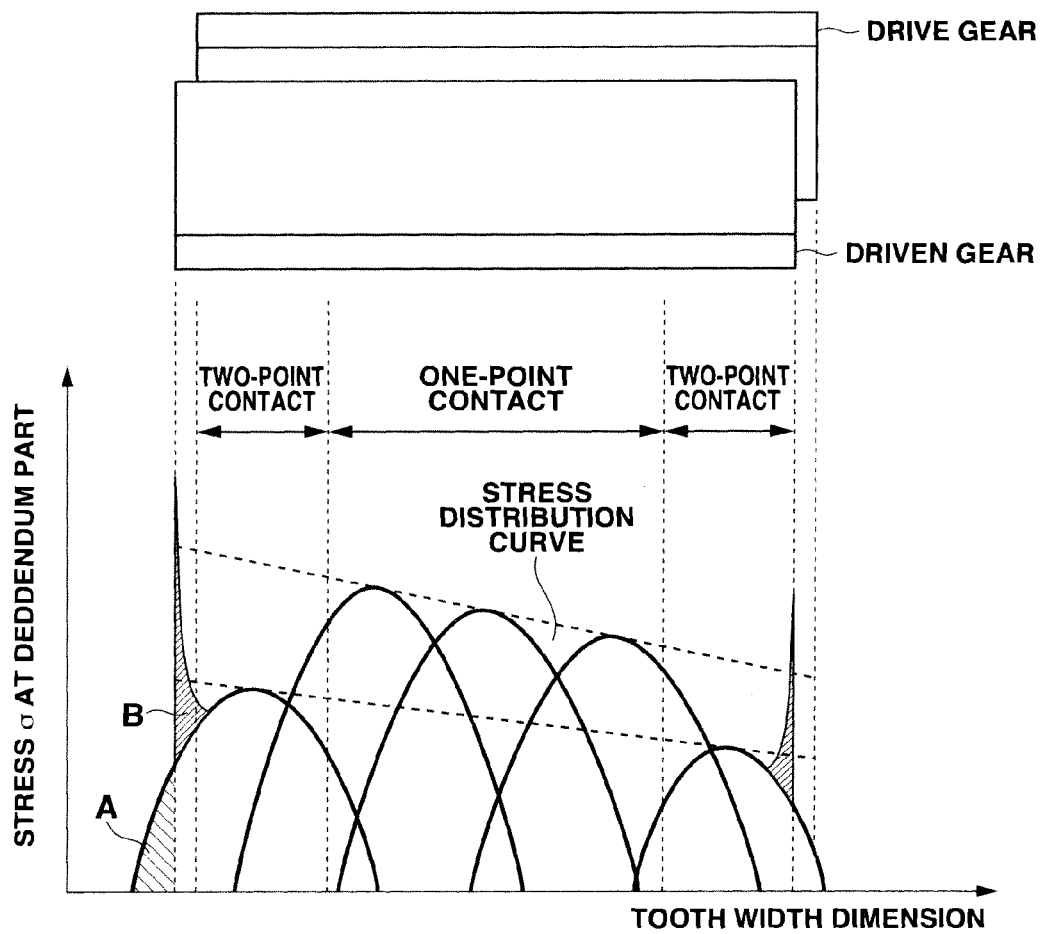
FIG. 5 is a rough explanatory view representing a stress distribution in a tooth width direction.

When a certain arbitrary tooth is started to be contacted (with another tooth of an opposing gear), an adjacent tooth thereto is always in the contact state. Thus, two teeth (of one of the pair of gears) are intermeshed (contacted with the other teeth of the opposing gear) at the contact start (a region a (two-point contact) in FIG. 3). At this time, since a torque to be transmitted toward the two teeth is shared, it can be thought that the stress is low. However, in the gear structure without the gear reinforcement member, an extremely high stress is actually developed. This is because, at the contact start, the addendum part of driven gear 2 and the deddendum part of drive gear 1 are contacted and the gear start is carried out from the gear side surface side. A large deformation is, thus, developed on the addendum part of driven gear 2 and in a proximity of the gear side surface thereof and the high stress is generated thereon. In other words, as shown in FIG. 5, a stress distribution curve, at an axial terminal part of arbitrary tooth, is protruded toward an outside of a tooth width (refer to a region A in FIG. 5). The stress corresponding to the outside part of the tooth width is burdened and concentrated on the axial terminal part of the tooth (refer to a region B in FIG. 5). Thus, a stress concentration is generated on the axial terminal part of the tooth and the stress becomes accordingly high. It should be noted that a considerably high stress is not developed in the case of drive gear 1 since drive gear 1 is contacted at the deddendum part although the contact position is placed in the proximity to the side surface part.

When the gear contact is gradually advanced, the contact position is moved toward the deddendum part and in the axial center part of the gear. Thus, the deformation becomes small and a maximum value of the stress is, at a stretch (in a stepwise manner), reduced (refer to points P1 and P3 in FIG. 2). Next, when the number of contact teeth is changed from two teeth (two-point contact) to one tooth (one-point contact), the stress is increased since the torque is shared by one tooth. However, the contact position is in the proximity to the deddendum part and in the proximity to the axial center of the gear. Hence, no considerable problem occurs. (refer to point P2 in FIG. 2 and a region b (one-point contact) in FIG. 3).

When the contact is furthermore advanced, the number of contact teeth is again changed from one tooth (one-point contact) to two teeth (two-point contact). The torque is shared by the two teeth. However, in the drive gear, the contact position is transferred from the deddendum part to the addendum part and, furthermore, is transferred toward axial side surface part side of drive gear 1. Hence, the stress at the addendum part of the drive gear is, at a stretch (in the stepwise manner), increased and a high stress is developed (a region c in FIG. 3). It should be noted that the high stress is developed at this region c due to the stress concentration as described above. It should also be noted that since, as shown in FIG. 5, the stress at each of the two-point contact (two teeth contact) regions (a and c) becomes low but the stress concentration such as region B in FIG. 5 (B=A in FIG. 5) is generated on the terminal part of each of the tooth of the gear, the stress accordingly becomes high. In this way, such a problem occurs that, in the gear structure without the reinforcement member, a very high stress is developed in the proximities of contact start and contact end so that a reduction in durability of the pair of gears is introduced.

To prevent the occurrence of the above-described problem, reinforcement members 10, 20 are fixed onto the side surfaces of each of the teeth of pair of gears. Specifically, reinforcement member 10 is fixed onto the side surface of drive gear 1 at the contact end side thereof in a positive revolution direction of drive gear 1. A contact region of drive gear 1 with driven gear 2 is moved from the contact start side of drive gear 1 to the contact end side as the gear contact is advanced and is moved from the deddendum part to the addendum part. At this time, as the contact position is moved toward the addendum part, the stress applied to the deddendum part becomes high. Hence, reinforcement member 10 is fixed onto the side surface at the contact end side in the positive revolution direction of drive gear 1. Thus, the stress applied to the deddendum part at the contact end side at which the stress applied to the deddendum part becomes high can be reduced. Then, more effective small sizing and light weighting of the gear and the improvement in strength of the gear can become possible. In addition, since the stress is reduced and the deformation of the gear can accordingly be reduced, the reduction in noises can become possible.

In the same way, reinforcement member 20 is fixed onto the side surface of driven gear 2 at the contact start side in the positive revolution direction of driven gear 2. In the teeth of driven gear 2, the contact region of drive gear 1 with driven gear 2 is moved from the gear contact start side to the gear contact end side and is moved from the addendum part to the deddendum part as the gear contact is advanced. At this time, as the contact region is moved toward the addendum part, the stress applied to the deddendum part becomes low. Hence, reinforcement member 20 is fixed onto the side surface of driven gear 2 at the contact start side of driven gear 2 in the positive revolution direction of driven gear 2. The deddendum part stress at the contact start side at which the stress applied to the deddendum part becomes high due to the input of force at the addendum part can be reduced. The more effective small sizing of the gear pair and/or the improvement in the strength of the gear pair can be achieved. In addition, since the stress is reduced to so that the deformation of the gear becomes small so that the reduction in the noises can be possible.

In this way, it provides a problem how reinforcement members should be fixed onto the side surfaces of the pair of gears when the reinforcement members are fixed onto the side surfaces of the gear pair. A role of the reinforcement members is to transmit the force transmitted to each of the teeth of one of the pair of gears to the other tooth of the other of the pair of gears via reinforcement members and to disperse the force to reduce the stress. Therefore, fixation sections of the arbitrary tooth which is on the center line of the arbitrary tooth and of another tooth which is on the center line thereof are located on the line of action are provided.

Figure 4:
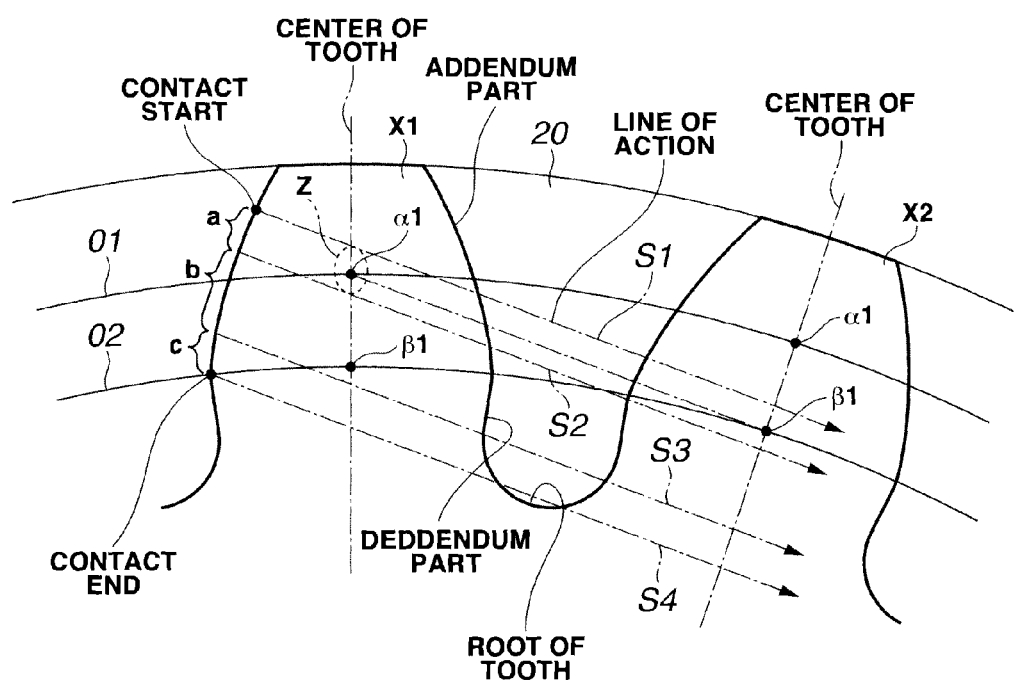
FIG. 4 is a rough explanatory view of the gear pair representing a setting logic of fixation sections in the preferred embodiment according to the present invention.

FIG. 4 shows a rough explanatory view representing a setting logic of the fixation sections in the preferred embodiment. Suppose that the arbitrary tooth of driven gear 2 is denoted by X1 and an adjacent tooth thereto is denoted by X2. In tooth X1, the force is transmitted from drive gear 1 to driven gear 2 in a range from a contact gear start point to a contact gear end point as viewed from a left side of FIG. 4. This force is acted upon the direction of the line of action. It is, first of all, preferable to arrange the fixation section at an approximately center of tooth X1 in the revolution direction thereof. This is because a stabilized force can be received even if the revolution direction is changed while the reduction in a tooth surface strength due to, for example, an input of heat when the fixation section is fixed thereonto by means of the laser welding is avoided. In addition, it is preferable to install the fixation section onto two-teeth contact region a. As explained in FIG. 3, the stress becomes highest when the number of contact teeth are two teeth and placed at the addendum part. Thus, one fixation section is formed on a region Z which is included between line of action S1 drawn from the contact start and line of action S2 representing a boundary of two-teeth contact region a and which provides a center of tooth X1.

In other words, the line of action passing through the position at which the fixation section is installed is the line of action in a state in which the simultaneous contact number of teeth are maximum (two teeth). In the case of the pair of helical gear, as shown in FIG. 4, the contact region of the teeth is changed radially and axially along with the revolution of the pair of gears. At this time, at a time point of the contact start and at a time point of the contact end, a terminal part in the axial direction of tooth provides the contact region. In this region, a stress concentration is generated so that the stress is accordingly high. Hence, when the simultaneous contact number of teeth of the gear provides the maximum (two teeth in the preferred embodiment) and the contact is placed at the addendum part, the stress generated on the contact tooth becomes maximum. Hence, point $\alpha1$ which is a first fixation section and point $\beta1$ which is a second fixation section are provided on the line of action in a region which is the addendum part and in which the simultaneous contact number of teeth of the gear provide maximum from among the regions, in each of which the simultaneous contact number of teeth of the gear are maximum. Thus, such an advantageous structure as to disperse the force applied to the tooth when the force applied to the tooth which is contacted to transmit the power becomes maximum can be obtained. It should be noted that, since point $\beta1$ is placed at the to deddendum part, an increase in stress cannot be introduced even if the force is acted upon point $\beta1$ from point $\alpha1$ via reinforcement member 20.

It should, herein, be noted that, specifically, one fixation section 20a is formed on point $\alpha1$ satisfying the requirement described above. When the force is acted upon the tooth surface, this force is transmitted from point $\alpha1$ via reinforcement member 20. Hence, when the line of action is drawn from point $\alpha1$, another fixation section 20a is formed on point $\beta1$ intersecting with a center of adjacent tooth X2. Fixation sections 20a are formed on two locations of an intersecting point between a gear concentric circle O1 passing through point $\alpha1$ and the center line of arbitrary tooth X1 and an intersecting point between a gear concentric circle O2 passing through point $\beta1$ and the center line of arbitrary tooth X1, in the tooth center of arbitrary tooth X1.

In other words, the positional relationship of fixation sections 20a is such that one fixation section is formed on point $\alpha1$ which provides the first fixation section provided at the addendum part of a radially more addendum part side than a deddendum circle of tooth X1 and the other fixation section is formed on point $\beta1$ which provides the second fixation section provided so as to correspond to point $\alpha1$ which is the first fixation section and provided at the deddendum part at the root of tooth side radially more deddendum part side than point $\alpha1$ which is the first fixation section, respectively. That is to say, the force acted upon the tooth which is contacted to transmit the power can be transmitted from point $\alpha1$ which is the first fixation section to point $\beta1$ which is the second fixation section via reinforcement member 20. Accordingly, the force applied to the tooth which is contacted to transmit the power can be dispersed. In addition, the force inputted to point $\alpha1$ which is placed at the addendum part can be transmitted to point $\beta1$ which is placed at the deddendum part. While a fixation area between the gear and the reinforcement member is suppressed from being increased, the stress acted upon the tooth can effectively be suppressed. It should be noted that, since the above-described setting logic can be applied to drive gear 1, the explanation thereon will herein be omitted.

As described above, in the preferred embodiment, action and advantage listed in the following can be obtained.

(1) In the gear structure in which the reinforcement member is fixed onto the side surface of the gear, the gear is provided with the fixation sections to fix the reinforcement member onto the side surface of the gear, the fixation sections being on the line of contact action. That is to say, the force acted upon the tooth which is contacted to transmit the power can be transmitted to the fixation section of the other tooth. The force acted upon the contacted tooth can accordingly be dispersed. Furthermore, since the force acted upon the contact tooth is in the direction of the line of contact action, the reinforcement member and the fixation sections are provided on the line of action. Thus, the more effective dispersion of the force acted upon the contact tooth can be achieved. Hence, the deddendum stress of the contact tooth can be reduced while the increase in the fixation area between the gear and the reinforcement member is prevented. The small sizing of the gear and/or the improvement in strength of the gear can be achieved. In addition, the reduction in the stress permits a reduction in the gear deformation and the reduction in noises can be achieved.

(2) The fixation sections include: point $\alpha1$ which provides the first fixation section provided on the addendum part at the radially more addendum side than the deddendum circle of each of the teeth of the gear and point $\beta1$ which provides the second fixation section provided so as to correspond to point $\alpha1$ and provided on the deddendum part at the radially more deddendum direction than point $\alpha1$. The force acted upon the contact tooth can be transmitted from point $\alpha1$ which is the first fixation section to point $\beta1$ which is the second fixation section formed on the tooth other than the contact tooth via the reinforcement member. The effective dispersion of the stress can be achieved. In addition, the force is transmitted from point $\alpha1$ placed at the addendum part to point $\beta1$ placed at the deddendum part. Thus, the stress can be reduced without introduction of the increase in the fixation area between the gear and the reinforcement member.

(3) The gear is the pair of helical gear and the line of action (line of contact action) is the line of action in the region which is placed at the addendum part and in which the gear simultaneous contact number of teeth are maximum from among the regions in each of which the gear simultaneous contact number of teeth are two (maximum). In the case of the pair of helical gear, when the gear simultaneous contact number of teeth are maximum (two teeth in the preferred embodiment) and the gear contact is carried out at the addendum part side, the stress generated on the tooth becomes maximum. Hence, point $\alpha1$ which is the first fixation section and point $\beta1$ which is the second fixation section are provided on the line of action in the region which is placed at the addendum part side and the simultaneous contact number of teeth gives the maximum from the regions in each of which the gear simultaneous contact number of teeth indicate maximum. Thus, such an advantageous structure as to disperse the force applied to the tooth when the force applied to the tooth which is contacted to transmit the power gives the maximum can be obtained. It should be noted that, since point $\beta1$ is the deddendum part, the increase in the stress is not introduced even if the force is acted upon point $\beta1$ from point $\alpha1$ via the reinforcement member.

(4) The gear is the pair of helical gear and reinforcement member 20 is fixed on the side surface of driven gear 2 which is at the contact start side in the positive revolution direction of driven gear 2. Thus, the deddendum stress of the contact start side at which the stress applied to the deddendum part becomes increased due to the input of force at the addendum part side can be reduced. The more effective small sizing of the gear or the improvement in the gear strength can become possible. In addition, the reduction in the stress makes the gear deformation small so that the reduction in noises becomes possible.

(5) The gear is the pair of helical gear and reinforcement member 10 is fixed on the side surface of drive gear 1 which is at the contact end side in the positive revolution direction of drive gear 1. Thus, the deddendum stress of the contact start side at which the stress applied to the deddendum part becomes increased due to the input of force at the addendum part side can be reduced. The more effective small sizing of the gear or the improvement in the gear strength can become possible. In addition, the reduction in the stress makes the gear deformation small so that the reduction in noises becomes possible.

As described hereinabove, the explanation on the preferred embodiment has been made. However, the present invention is not limited to the structure of the preferred embodiment. In the preferred embodiment, each of the fixation sections is formed by an approximately circular welding. However, each fixation section may be provided with a welding region having a length in the radial direction. Although, in the preferred embodiment, the reinforcement member is fixed onto an external gear, the present invention is not limited to this and, for example, the reinforcement member may be fixed onto an internal gear. It should be noted that, although the simultaneous contact number of teeth of the external gear is less than the simultaneous contact number of teeth of the external gear, the effect of stress reduction due to the fixation of the reinforcement member in the case of the external gear is larger. In addition, although the helical gear is described in the preferred embodiment, the present invention can be applied to a spur gear or another type of gear.

In the preferred embodiment, the reinforcement member is of the disc shape. However, the present invention is not limited to this. A shape of the reinforcement member and the number thereof are not limited if the first fixation section and the second fixation section can be linked together. For example, a bar-shaped member may be used as the reinforcement member to link the first and second fixation sections.

Although, in the preferred embodiment, the second fixation section corresponding to the first fixation section is provided on the tooth adjacent to the arbitrary tooth, the present invention is not limited to this and, for example, the second fixation section corresponding to the first fixation section on the arbitrary tooth may be provided on a tooth adjacent to the arbitrary tooth via one tooth (sandwiched by one tooth) or via a plurality of teeth (sandwiched by the plurality of teeth). It should be noted that, if the second fixation section corresponding to the first fixation is provided on the tooth adjacent to the arbitrary tooth, a distance between the first fixation section and the second fixation section becomes short so that the gear strength can effectively be improved irrespective of a spring coefficient of the reinforcement member. In addition, it is effective in the gear strength that the spring coefficient of the reinforcement member extended between the first and second fixation sections is set to be higher.

This application is based on prior Japanese Patent Applications No. 2010-051357 filed in Japan on Mar. 9, 2010 and No. 2010-247308 filed in Japan on Nov. 4, 2010. The entire contents of this Japanese Patent Applications No. 2010-051357 and 2010-247308 are herein incorporated by reference in its entirety. Although the invention has been described above by reference to certain embodiments of the invention, the invention is not limited to the embodiment described above. Modifications and variations of the embodiments described above will occur to those skilled in the art in light of the above teachings. The scope of the invention is defined with reference to the following claims.

What is claimed is:

1. A gear structure comprising:
   a reinforcement member fixed onto a side surface of a gear; and
   a fixation section configured to fix the reinforcement member onto the side surface of the gear, the fixation section being provided on a line of contact action of the gear,
   wherein the fixation section is set at two points, and
   wherein one point is on the line of contact action of the gear in a region in which a simultaneous contact number of teeth at a contact start of the gear is maximized and another point is on the line of contact action of the gear in another region in which the simultaneous contact number of teeth at a contact end of the gear is maximized.

2. The gear structure as claimed in claim 1, wherein the fixation section is set on intersecting points between each line of contact action of the gear and a center line of a width of each of the teeth of the gear.

3. The gear structure as claimed in claim 1, wherein the gear is a pair of helical gears and the reinforcement member is fixed onto the side surface of a driven gear of the pair of helical gears at a contact start side in a positive revolution direction of the driven gear.

4. The gear structure as claimed in claim 1, wherein the gear is a pair of helical gears and the reinforcement member is fixed onto the side surface of a drive gear of the pair of helical gears at a contact end side in a positive revolution direction of the drive gear.

5. The gear structure as claimed in claim 1, wherein the maximized simultaneous contact number of teeth of the gear is two.

* * * * *